United States Patent [19]
Hynecek

[11] Patent Number: 5,877,520
[45] Date of Patent: Mar. 2, 1999

[54] TRENCH LATERAL OVERFLOW DRAIN ANTIBLOOMING STRUCTURE FOR VIRTUAL PHASE CHARGE COUPLED DEVICES WITH VIRTUAL GATE ELEMENT

[75] Inventor: Jaroslav Hynecek, Dallas, Tex.

[73] Assignee: Texas Instruments Incorporated, Dallas, Tex.

[21] Appl. No.: 916,018

[22] Filed: Aug. 21, 1997

[51] Int. Cl.$^6$ .................................................. H01L 27/108
[52] U.S. Cl. ..................... 257/223; 257/215; 257/220; 257/242; 257/247; 257/284; 257/328; 257/330; 438/75; 438/76; 438/77; 438/78; 438/81; 438/79
[58] Field of Search ....................... 257/215, 220, 257/223, 242, 244, 247, 284, 282, 328, 329, 330, 332, 334, 192, 251, 912; 438/75–78, 79–81

[56] References Cited

U.S. PATENT DOCUMENTS

| | | |
|---|---|---|
| 5,151,380 | 9/1992 | Hynecek ................................ 437/53 |
| 5,286,990 | 2/1994 | Hynecek ................................ 257/247 |
| 5,341,008 | 8/1994 | Hynecek ................................ 257/231 |
| 5,453,632 | 9/1995 | Hynecek et al. ...................... 257/247 |
| 5,464,996 | 11/1995 | Hynecek ................................ 257/238 |
| 5,552,620 | 9/1996 | Lu et al. ................................ 257/330 |

*Primary Examiner*—Tom Thomas
*Assistant Examiner*—Fetsum Abraham
*Attorney, Agent, or Firm*—Alan K. Stewart; Wade James Brady, III; Richard L. Donaldson

[57] ABSTRACT

The lateral overflow drain for charge coupled devices includes: a semiconductor region 70 of a first conductivity type having a trench 92; a drain region 24 of a second conductivity type below the trench 92; a gate 20 in the trench 92 overlying and separated from a portion of the semiconductor region 70; and a virtual gate 30 of the first conductivity type in the semiconductor region 70 adjacent the trench 92.

16 Claims, 2 Drawing Sheets

TRENCH LATERAL OVERFLOW DRAIN ANTIBLOOMING STRUCTURE FOR VIRTUAL PHASE CHARGE COUPLED DEVICES WITH VIRTUAL GATE ELEMENT

CROSS-REFERENCE TO RELATED APPLICATIONS

Serial No. Filing Date TI Case No. 08/220,087 Mar. 30, 1994 TI-19091

FIELD OF THE INVENTION

This invention generally relates to charge coupled devices, and more particularly relates to overflow drain structures for charge coupled devices.

BACKGROUND OF THE INVENTION

Without limiting the scope of the invention, its background is described in connection with antiblooming structures for charge coupled device image sensors, as an example. Antiblooming action is important for operation of CCD sensor imaging scenes whose range of illumination intensities greatly exceeds the dynamic range of the sensor. With strong antiblooming action, the optical system can be adjusted for optimum performance at low light levels, and the high overloads associated with the bright portions of the scene can be absorbed by the antiblooming. Two major forms of antiblooming exist in the prior art. One uses charge recombination at the semiconductor-insulator interface to remove excess charge while the other forms a barrier and drain structure next to or underneath the pixel that removes any charge in excess of full well. Disadvantages of the charge recombination antiblooming include: large size; limited charge removal rate which is particularly a problem for short duration light pulses; constant clocking which causes large power consumption; and large interface state density which creates problems for dark current generation which is increased by high interface state density. A disadvantage of the prior art barrier and drain structures is that the size of the structures are not readily reduced due to the two dimensional effects of the potential profile and due to the necessary tolerances which are present in the mask alignment process.

SUMMARY OF THE INVENTION

Generally, and in one form of the invention, a lateral overflow drain for charge coupled devices includes: a semiconductor region of a first conductivity type having a trench; a drain region of a second conductivity type below the trench; a gate in the trench overlying and separated from a portion of the semiconductor region; and a virtual gate of the first conductivity type in the semiconductor region adjacent the trench.

This invention provides several advantages. One advantage is a self-alignment feature which improves uniformity of the antiblooming performance and thus increases the manufacturing yield. A second advantage is the smaller size which allows for fabrication of small pixel CCD image sensors such as a five micron pixel size. A third advantage is that the antiblooming barrier can be adjusted by the depth of the trench. A fourth advantage is that the smaller size provides less obstruction to incident light and does not consume as much of the valuable well area.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
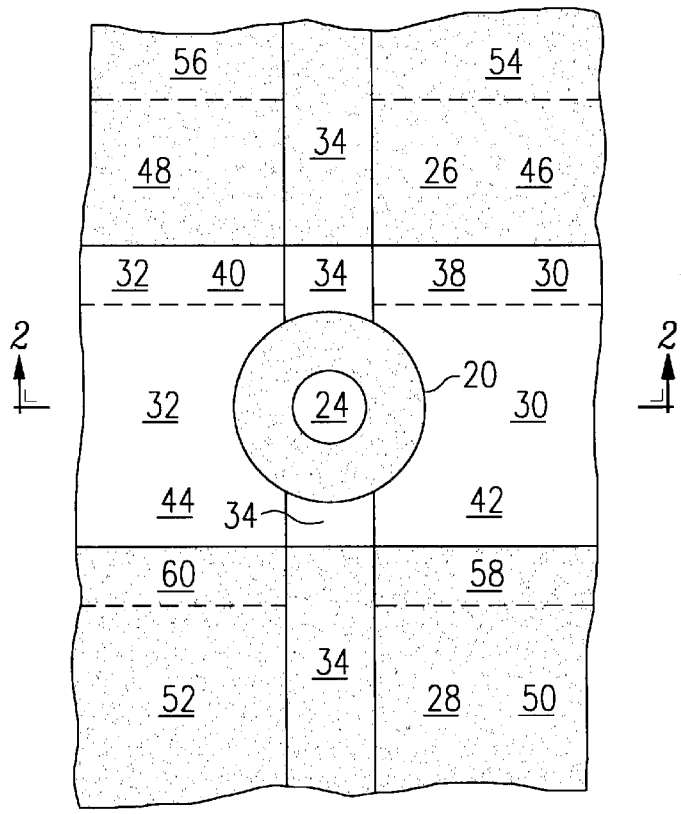
FIG. 1 is a plan view of a first preferred embodiment trench lateral overflow drain antiblooming structure.

Referring to FIG. 1, a plan view of a first preferred embodiment trench lateral overflow drain antiblooming structure is shown. The antiblooming structure shown in FIG. 1 includes drain gate 20, N+ region (drain) 24, clocked gates (polysilicon) 26 and 28, virtual gates 30 and 32, channel stop 34, virtual barriers 38 and 40 below the virtual gates, virtual wells 42 and 44 below the virtual gates, clocked wells 46, 48, 50, and 52 below the clocked gates, and clocked barriers 54, 56, 58, and 60 below the clocked gates. The drain structure is formed at a face of a P type semiconductor substrate or layer. The drain structure is surrounded by virtual phase charge coupled device (CCD) cells arranged in a plurality of rows and columns. The semiconductor layer is preferably a semiconductor substrate, but can take other forms such as an epitaxial layer.

Figure 2:
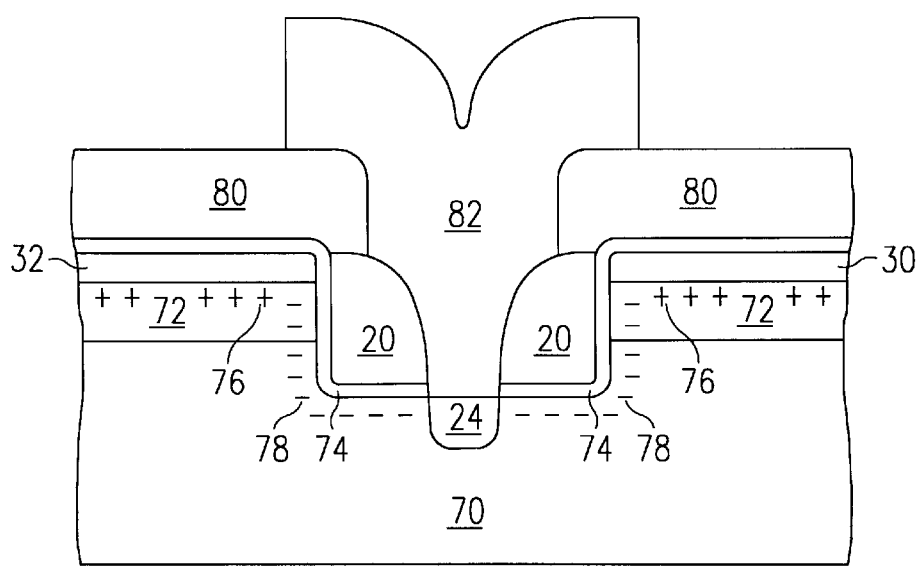
FIG. 2 is a cross-section of a first preferred embodiment trench lateral overflow drain antiblooming structure.

FIG. 2 is a cross-section of the first preferred embodiment lateral overflow drain shown in FIG. 1. The structure of FIG. 2 includes a P type silicon layer 70, an N type layer 72 in the layer 70, P+ virtual gates 30 and 32 formed in the upper portion of N type layer 72, N+ drain (lateral drain) 24, gate insulator layer 74, drain gate 20, virtual well donor implants 76 in the N type layer (buried layer) 72, barrier implants 78, insulator layer 80, and drain interconnect (conductive interconnect) 82.

Figure 5:
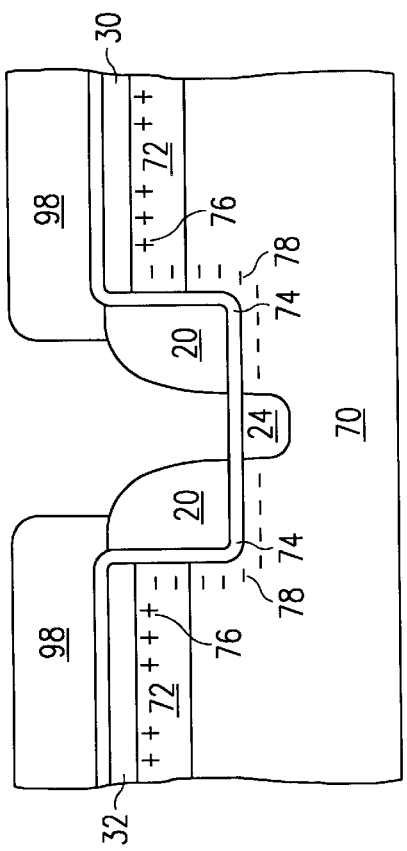
FIGS. 3–5 show the device of FIG. 2 at three stages of fabrication.
Figure 3:
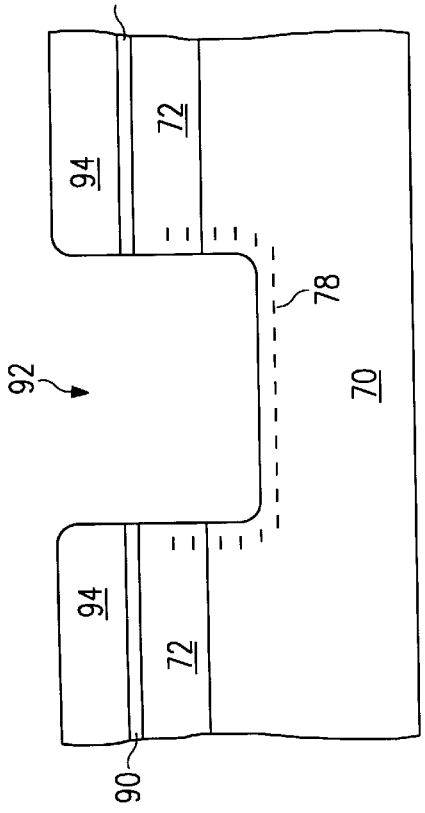
Figure 4:
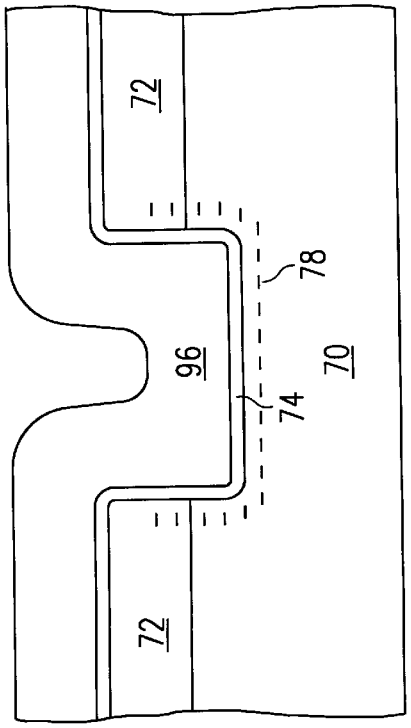

FIGS. 3–5 illustrate successive steps in a process for fabricating the trench lateral charge drain according to the preferred embodiment, as shown in FIG. 2. Referring first to FIG. 3, an oxide layer 90 is formed over the surface of the device. Then an N type layer (buried layer) 72 is formed in P type semiconductor layer 70 (alternatively, N type layer 72 can be formed after the trench 92 is formed). N type layer 72 may be formed by ion implantation. A dopant such as phosphorus may be used as the implant dopant. The trench region 92 is then patterned using photoresist layer 94 and etched, as shown in FIG. 3. In the preferred embodiment, the trench is approximately 0.5 to 1.0 micron deep. Next, an implant into the walls and bottom of trench 92 in N type layer 72 forms the barrier implants 78 (acceptor implants) shown in FIG. 3. This implant is done with a P type dopant such as boron. The barrier implants 22 can be formed by angular implants and/or a rotating substrate. An optional anneal process can then be used to repair damage to the walls of the trench 92. After photoresist layer 94 and oxide layer 90 are removed, a gate insulator (oxide) 74 is then formed on the device, as shown in FIG. 4. The gate insulator layer 74 is preferably formed of oxide and may be grown from the surface.

Next, gate layer 96 is deposited, as shown in FIG. 4, and doped to be conductive. Next, gate layer 96 is back etched using an anisotropic etch which removes the material in the vertical direction to form drain gate 20, as shown in FIG. 5. The diameter of trench 92 is selected such that an opening results at the bottom after the etch is completed. The clocked gates 26 and 28 of the virtual phase CCD, shown in FIG. 1, may be formed in the same step as the drain gate 20. The drain gate 20 is formed of a material such as doped polysilicon. For a polysilicon gate 20, from 500 to 5000 Angstroms of a polysilicon layer is deposited, doped, patterned, and etched to form drain gate 20. The gate layer 96 may be doped in place by a dopant such as phosphoric oxytrichloride ($POCl_3$).

After the drain gate 20 is formed, P+ virtual gates 30 and 32 are formed. A dopant such as boron is implanted into N type layer 72 to form P+ virtual gates 30 and 32, shown in FIG. 5, which are self aligned to the drain gate 20. Then the donor implants 76, shown in FIG. 5, are implanted. The donor implants 76 are also self-aligned to the drain gate 20. This implant is done with an N type dopant such as phosphorous. Next, photoresist 98 is applied and N+ region 24 is formed. N+ region 24 is self-aligned to the drain gate 20, as shown in FIG. 5. This implant is done with an N type dopant such as phosphorous.

The channel stop regions (P+ type) 34 and 36, shown in FIG. 1, can be formed before the trench etch, formed after the gate deposition, or partially formed before the trench etch and completed after the gate deposition.

Then an insulator layer 80 is formed over the surface of the structure, as shown in FIG. 2. Insulator layer 80 can be formed of oxide. Next, a contact opening to the drain gate 20 and N+ region 24 is patterned and etched through the insulator layer 74, as shown in FIG. 2. Then a metal layer is deposited and etched to form conductive interconnect 82, as shown in FIG. 2. Interconnect 82 connects to both the drain gate 20 and N+ region 24. Various metal combinations can be used for conductive interconnect 82 such as Ti and Al, TiN and Al, W, TiW, and Al.

The operation of the device of FIGS. 1 and 2 is described below. For antiblooming, the drain gate 20 is biased to create an antiblooming barrier with a potential level lower than the potential level of the virtual wells 42 and 44. When excess charge accumulates in virtual well 42 or 44, the potential level of the virtual well is lowered below the potential level of the antiblooming barrier. Then the excess charge from the virtual well flows across the antiblooming barrier and into the drain.

For charge clearing purposes, the drain gate 20 is biased more positive such that the potential level of the antiblooming barrier is higher than the virtual wells 42 and 44. This allows all charge in the virtual wells 42 and 44 to flow across the antiblooming barrier and out through the drain. Charge removal from the virtual wells 42 and 44 resets the photocell for the next charge integration period. This reset process provides a complete charge removal from the structure because there is no charge remaining in the virtual wells 42 and 44 after the charge is transferred to the drain.

Figure 6:
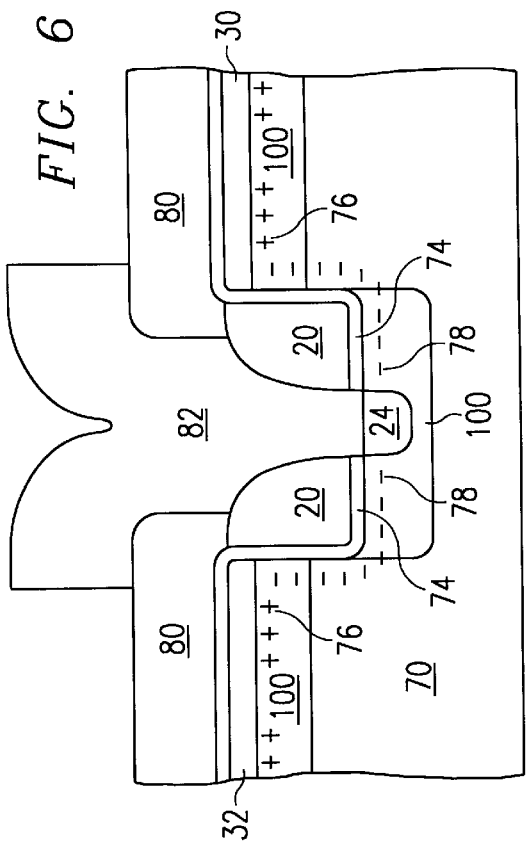
FIG. 6 shows a cross-section of a second preferred embodiment trench lateral overflow drain antiblooming structure.

FIG. 6 shows a cross-section of a second preferred embodiment trench lateral overflow drain antiblooming structure. The device in FIG. 6 is the same as the device shown in FIG. 1 except that the N type buried channel 100 is implanted after the trench is formed. Therefore, the N type region 100 is below the trench, as shown in FIG. 6.

The preferred embodiments provide several advantages. A first advantage is the self-alignment. The barrier implant 78 is aligned to the trench 92. The N+ region 24 is aligned to the drain gate 20. The self-alignment feature improves uniformity of the antiblooming performance and thus increases the manufacturing yield. A second advantage is that the diameter of the structure is significantly smaller than the prior art lateral overflow drains. A diameter of two microns or smaller is readily achievable. This allows for fabrication of small pixel CCD image sensors such as a five micron pixel size. A third advantage is that the antiblooming barrier can be adjusted not only by the barrier implant 78, but also by the depth of the trench 92. A fourth advantage is that the smaller size improves the performance of the CCD devices. The smaller size provides less obstruction to incident light and does not consume as much of the valuable well area.

A few preferred embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A lateral overflow drain for charge coupled devices comprising:

a semiconductor region of a first conductivity type having a trench;

a drain region of a second conductivity type below the trench;

barrier implants surrounding the trench and adjacent the drain region;

a gate in the trench overlying and separated from at least a portion of the barrier implants; and a virtual gate of the first conductivity type in the semiconductor region adjacent the trench.

2. The device of claim 1 further comprising a channel stop region in the semiconductor region spaced apart from the drain region and adjacent the virtual gate.

3. The device of claim 1 further comprising a conductive interconnect overlying and connected to a first portion of the gate.

4. The device of claim 3 further comprising an insulator layer over a second portion of the gate and below a portion of the conductive interconnect.

5. The device of claim 3 wherein the conductive interconnect is metal.

6. The device of claim 1 further comprising donor implants underlying at least a portion of the virtual gate.

7. The device of claim 1 wherein the electrode is held at a first voltage for antiblooming and at a second voltage for clearing charge from virtual wells, the second voltage is higher than the first voltage.

8. The device of claim 1 wherein the virtual gate forms a virtual barrier region and a virtual well region.

9. The device of claim 1 further comprising a buried layer of the second conductivity type in the semiconductor region and below the virtual gate.

10. The device of claim 9 wherein a portion of the buried layer is below the trench.

11. The device of claim 1 wherein the gate is polysilicon.

12. The device of claim 1 further comprising an insulator layer between the barrier implants and the gate.

13. A lateral overflow drain for charge coupled devices comprising:

a semiconductor region of a first conductivity type having a trench;

a drain region of a second conductivity type below the trench;

a gate in the trench overlying and separated from a portion of the semiconductor region; and a virtual gate of the first conductivity type in the semiconductor region adjacent the trench.

14. A lateral overflow drain for charge coupled devices comprising:

a semiconductor region of a first conductivity type having a trench;

a drain region of the second conductivity type formed in the semiconductor region below the trench;

barrier implants formed in the semiconductor region surrounding the trench and adjacent the drain region;

a virtual gate of the first conductivity type in the semiconductor region spaced apart from the drain region and partially surrounding the drain region, the virtual gate forms a virtual well for carriers of the second conductivity type; and a gate connected to the drain region, and overlying and separated from at least a portion of the barrier implants, the gate and the barrier implants form an antiblooming barrier between the virtual well and the drain region.

15. The device of claim 14 further comprising donor implants in the semiconductor region below a portion of the virtual gate.

16. The device of claim 14 wherein the barrier implants are P type implants.

* * * * *